United States Patent
Wu et al.

(10) Patent No.: US 8,305,791 B2
(45) Date of Patent: Nov. 6, 2012

(54) MEMORY CIRCUIT HAVING MEMORY CELLS WITH COMMON SOURCE/DRAIN REGION ELECTRICALLY ISOLATED FROM ALL BIT LINES, SYSTEM, AND FABRICATION METHOD THEREOF

(75) Inventors: Ching-Wei Wu, Caotun (TW); Cheng Hung Lee, Hsinchu (TW); Li-Chen Chen, Taipei (TW); Weiyang Jiang, Zhejiang (CN)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 197 days.

(21) Appl. No.: 12/784,133

(22) Filed: May 20, 2010

(65) Prior Publication Data

US 2011/0019460 A1    Jan. 27, 2011

Related U.S. Application Data

(60) Provisional application No. 61/227,576, filed on Jul. 22, 2009.

(51) Int. Cl.
*G11C 17/00* (2006.01)
(52) U.S. Cl. .......................................... 365/104; 365/94
(58) Field of Classification Search ................. 365/104, 365/190, 94
See application file for complete search history.

(56) References Cited

U.S. PATENT DOCUMENTS

| | | | | |
|---|---|---|---|---|
| 5,140,389 A * | 8/1992 | Kimura et al. | ................ | 257/309 |
| 7,102,926 B2 * | 9/2006 | Lee et al. | ................. | 365/185.11 |

* cited by examiner

*Primary Examiner* — VanThu Nguyen
*Assistant Examiner* — Khamdan Alrobaie
(74) *Attorney, Agent, or Firm* — Lowe Hauptman Ham & Berner, LLP

(57) ABSTRACT

A memory circuit includes a plurality of bit lines. A first memory cell and a second memory cell are coupled in series. Each of the first memory cell and the second memory cell is capable of storing a first type datum. The first memory cell and the second memory cell share a first common source/drain (S/D) region. The first common S/D region is electrically isolated from all of the bit lines.

20 Claims, 7 Drawing Sheets

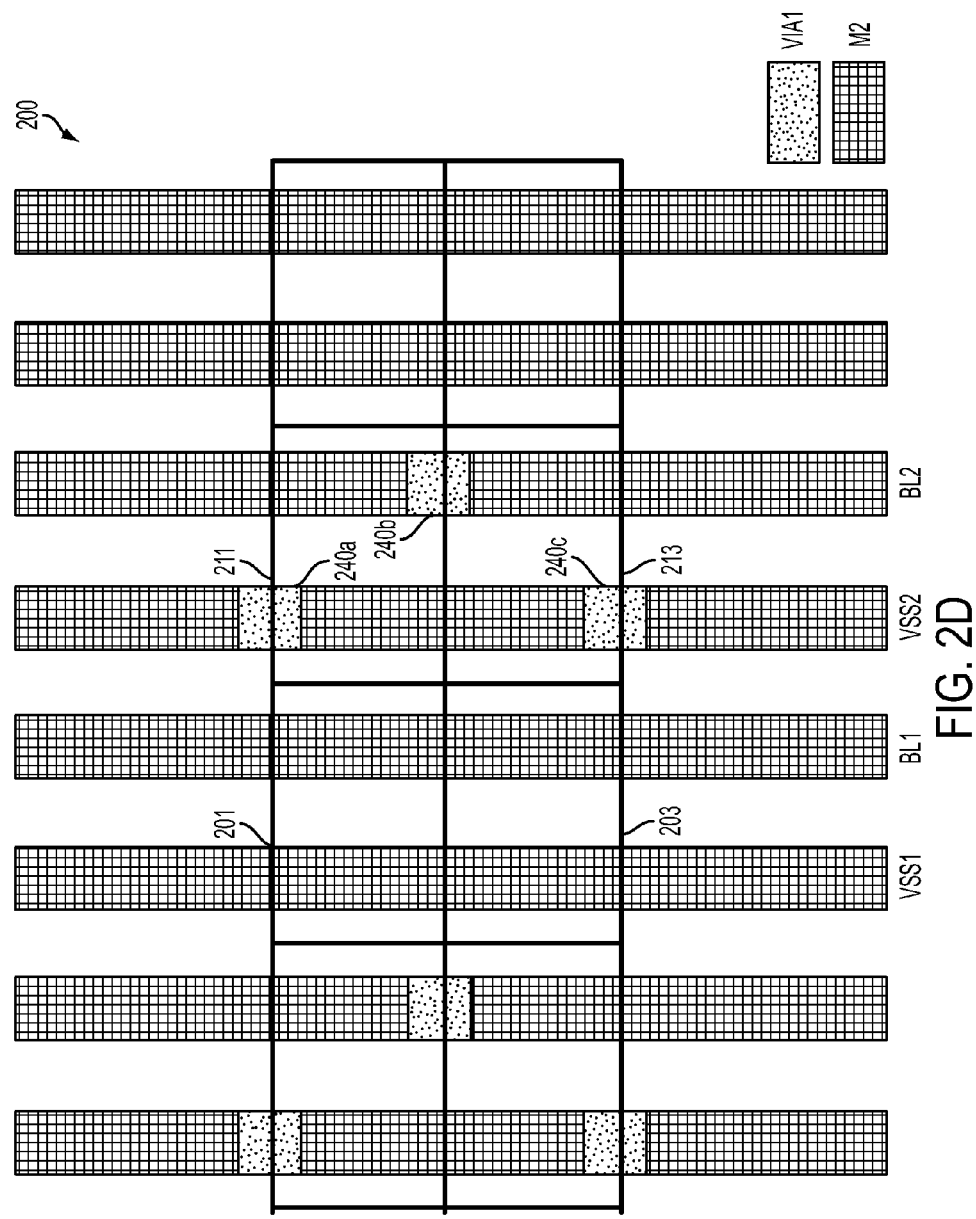

MEMORY CIRCUIT HAVING MEMORY CELLS WITH COMMON SOURCE/DRAIN REGION ELECTRICALLY ISOLATED FROM ALL BIT LINES, SYSTEM, AND FABRICATION METHOD THEREOF

CROSS-REFERENCE TO RELATED APPLICATIONS

The present application claims priority of U.S. Provisional Patent Application Ser. No. 61/227,576, filed on Jul. 22, 2009, which is incorporated herein by reference in its entirety.

TECHNICAL FIELD

The present disclosure relates generally to the field of semiconductor circuits, and more particularly, to memory circuits, systems, and fabrication methods thereof.

BACKGROUND

Memory circuits have been used in various applications. Conventionally, memory circuits can include read only memory (ROM), dynamic random access memory (DRAM), static random access memory (SRAM), and other non-volatile memory circuits. A ROM circuit includes a plurality of memory cells. Each ROM memory cell usually has a single transistor. The single transistor can store a datum with logic "0" or "1."

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 2A-2D are schematic drawings illustrating various layers of an exemplary ROM circuit.

DETAILED DESCRIPTION

Figure 1:
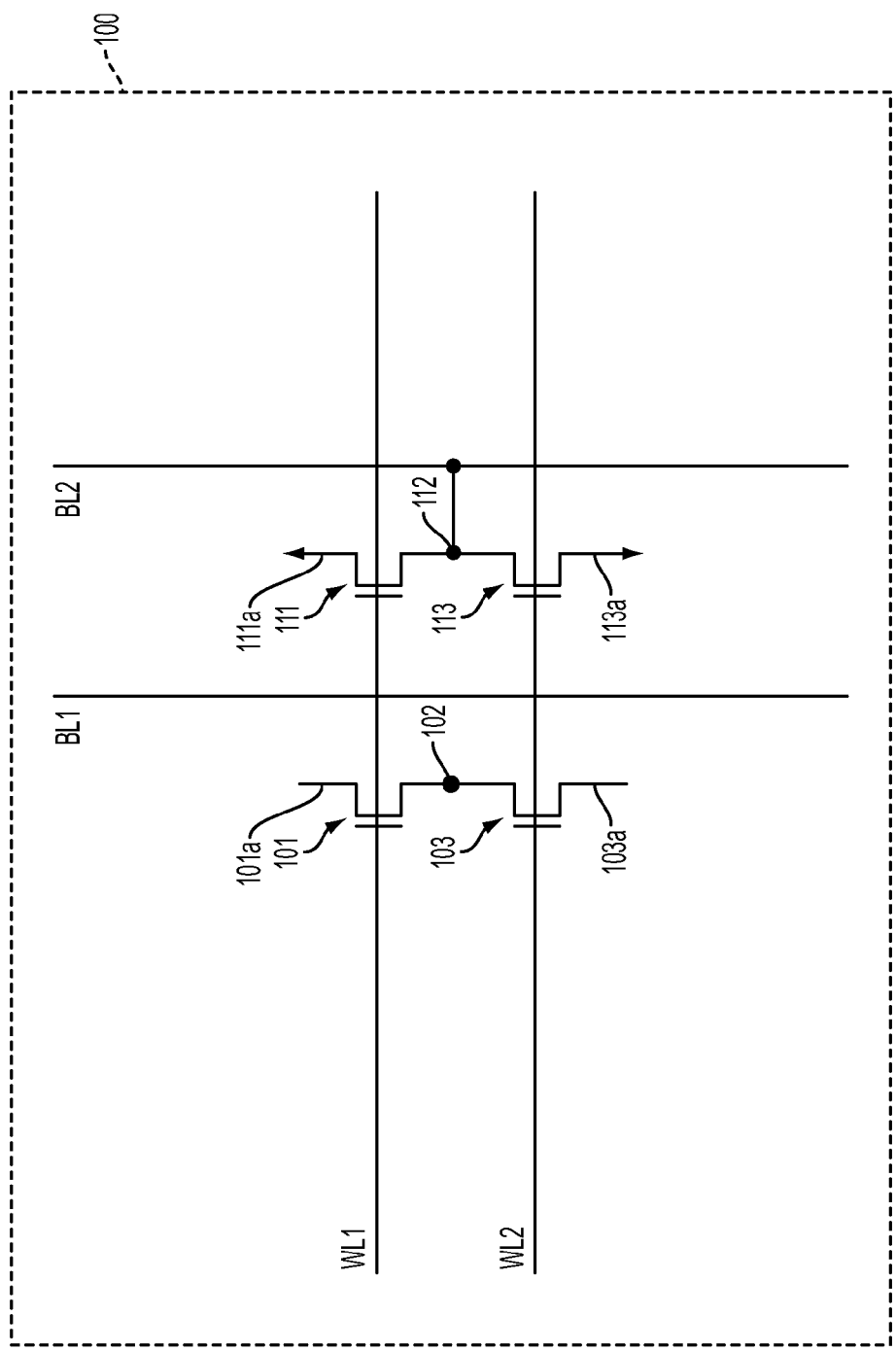
FIG. 1 is a schematic drawing illustrating an exemplary memory circuit.

Conventionally, a ROM cell has a source end and a drain end. The drain end of the ROM cell is coupled with a bit line BL. A gate of the ROM cell is coupled with a word line WL. For source-side programming the ROM cell to logic "1", the source end of the ROM cell is electrically coupled with a ground or a supply voltage VSS. For source-side programming the ROM cell to logic "0", the source end of the ROM cell is electrically isolated from a ground or a supply voltage VSS. For example, a via plug is free from being formed between the source end of the ROM cell and the bit line. No matter how the ROM cell is programmed to logic "1" or "0", the drain end of the ROM cell is coupled with the bit line.

It is found that the coupling of the drain end of the logic "0" ROM cell with the bit line BL increases the loading of the bit line BL during access operations. The bit line loading includes capacitances related to junctions, a contact layer, a metal 1 (M1) layer, and/or via 1 layer. The bit line loading can jeopardize operating speeds, e.g., access speeds of ROM cells. The bit line loading becomes worse if more drain ends of logic "0" memory cells are electrically coupled with their corresponding bit line BL.

Based on the foregoing, memory circuits, systems, and fabrication methods thereof are desired.

It is understood that the following disclosure provides many different embodiments, or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary memory circuit. In FIG. 1, a memory circuit 100 can include a memory array (not shown) including a plurality of word lines WLs, e.g., word lines WL1 and WL2, and a plurality of bit lines, e.g., bit lines BL1 and BL2. The memory circuit 100 can be a read only memory (ROM) circuit, a static random access memory (SRAM) circuit, an embedded SRAM circuit, dynamic random access memory (DRAM) circuit, an embedded DRAM circuit, a non-volatile memory circuit, e.g., FLASH, EPROM, E$^2$PROME, a field-programmable gate array circuit, a logic array circuit, and/or other memory circuit.

Referring to FIG. 1, the memory circuit 100 can include a first memory cell, e.g., memory cell 101, and a second memory cell, e.g., memory cell 103. The memory cells 101 and 103 can be coupled in series parallel with the bit line BL1. Each of the memory cells 101 and 103 is capable of storing a first type datum, e.g., logic "0." The memory cells 101 and 103 can share a common source/drain (S/D) region 102. The common S/D region 102 can be electrically isolated from all of the bit lines BL1 and BL2 of the integrated circuits 100.

As noted, each of the memory cells 101 and 103 can store a logic "0" and the common S/D region 102 can be disposed between the memory cells 101 and 103. For embodiments using a source-side programming, the common S/D region 102 can include drain ends of the memory cells 101 and 103. Source ends 101a and 103a of the memory cells 101 and 103, respectively, can be electrically isolated from all of the bit lines BL1 and BL2 of the integrated circuits 100. If the memory cell 101 is to be accessed, the bit line BL1 and the word line WL1 can be selected. Since both of the source end 101a and the drain end of the memory cell 101 are electrically isolated from the bit line BL1, no substantial current flow can be sensed by a sense amplifier (not shown) coupled with the bit line BL1. The logic "0" datum stored in the memory cell 101 can be accessed.

In some embodiments, the memory circuit 100 can include a third memory cell, e.g., memory cell 111, and a fourth memory cell, e.g., memory cell 113. The memory cells 111 and 113 can be coupled in series parallel with the bit line BL2. Each of the memory cells 111 and 113 is capable of storing a second type datum, e.g., logic "1." The memory cells 111 and 113 can share a common source/drain (S/D) region 112. The common S/D region 112 can be coupled with the bit line BL2.

As noted, each of the memory cells 111 and 113 can store a logic "1" and the common S/D region 112 can be disposed between the memory cells 111 and 113. For embodiments using a source-side programming, the common S/D region 112 can include drain ends of the memory cells 111 and 113. Source ends 111a and 113a of the memory cells 111 and 113, respectively, can be coupled with a ground or VSS. If the memory cell 111 is to be accessed, the bit line BL2 and the word line WL1 can be selected. The word line WL1 can turn on the memory cell 111 and a current can flow on the BL2 and through the memory cell 111. A sense amplifier (not shown) coupled with the bit line BL2 can sense the current flow on the bit line BL2. The logic "1" datum stored in the memory cell 111 can thus be accessed.

As noted, the memory cells 101 and 103 can store the logic "0" data. The common S/D region 102 of the memory cells 101 and 103 is electrically isolated from the bit lines BL1 and BL2. It is found that electrically isolating the common S/D 102 from the bit line BL1 can desirably reduce a loading, e.g., capacitance, of the bit line BL1 during operations of the memory circuit 100.

Table 1 shows single bit line loadings of a conventional memory circuit and the memory circuit 100. Each of the conventional memory circuit and the memory circuit 100 can have a 128×8 memory array. The 128×8 memory array can include 128 word lines and 8 bit lines. Each bit line has 128 memory cells coupled in series. The conventional memory circuit and the memory circuit 100 can be formed by, for example, a 40-nm manufacturing process. A coding layer of each of the conventional memory circuit and the memory circuit 100 is a via 1 layer.

If all of the 128 memory cells of a single bit line can have logic "1" data, common S/D regions of the 128 memory cells of the single bit line of the conventional memory circuit and the memory circuit 100 are electrically coupled with the bit line BL. Both the conventional memory circuit and the memory circuit 100 have a bit line loading of about 30.07 femtofarads (fF).

If all of the 128 memory cells have logic "0" data, common S/D regions of the 128 memory cells of a single bit line of the conventional memory circuit are electrically coupled with the bit line BL. The conventional memory circuit still has a bit line loading of about 30.07 fF. In contrary to the conventional memory circuit, common S/D regions of the 128 memory cells of a single bit line of the memory circuit 100 are electrically isolated from the bit line BL. The memory circuit 100 can have a bit line loading of about 9.14 fF.

If a half of the 128 memory cells have logic "0" data and another half of the 128 memory cells have logic "1" data, common S/D regions of the 128 memory cells of a single bit line of the conventional memory circuit are still electrically coupled with the bit line BL. The conventional memory circuit has a bit line loading of about 30.07 fF. In contrary to the conventional memory circuit, half of common S/D regions of the 128 memory cells of a single bit line of the memory circuit 100 are electrically isolated from the bit line BL. The memory circuit 100 can have a bit line loading of about 19.60 fF.

TABLE 1

|  | Conventional memory circuit | Memory circuit 100 |
|---|---|---|
| 128 logic "1" | 30.07 fF | 30.07 fF |
| 128 logic "0" | 30.07 fF | 9.14 fF |
| 64 logic "1" and 64 logic "0" | 30.07 fF | 19.60 fF |

From the foregoing, no matter how the memory cells are to be programmed as logic "0" or "1", the common S/D regions of the bit line of the conventional memory circuit are coupled with the bit line. In contrary to the conventional memory circuit, the common S/D regions of the bit line of the memory circuit 101 can be electrically isolated from the bit line if the memory cells have logic "0" data. The more the logic "0" memory cells are disposed, the more the bit line loading can be reduced. The operating speed of the integrated circuit 100 can be achieved.

It is noted that the logic "0" and "1" described above in conjunction with FIG. 1 is merely exemplary. In other embodiments, the datum stored in a memory cell that is electrically isolated from the bit line can be referred to as a logic "1" and the datum stored in another memory cell that is electrically coupled with the bit line can be referred to as a logic "0." It is also noted that the source-end programming described above in conjunction with FIG. 1 is merely exemplary. In other embodiments using drain-end programming, the S/D regions 102 and 112 can be source ends of the memory cells 101, 103 and 111, 113, respectively. The elements 101a, 103a, 111a, and 113a can be referred to drain ends of the memory cells 101, 103, 111, and 113, respectively.

Figure 2A:
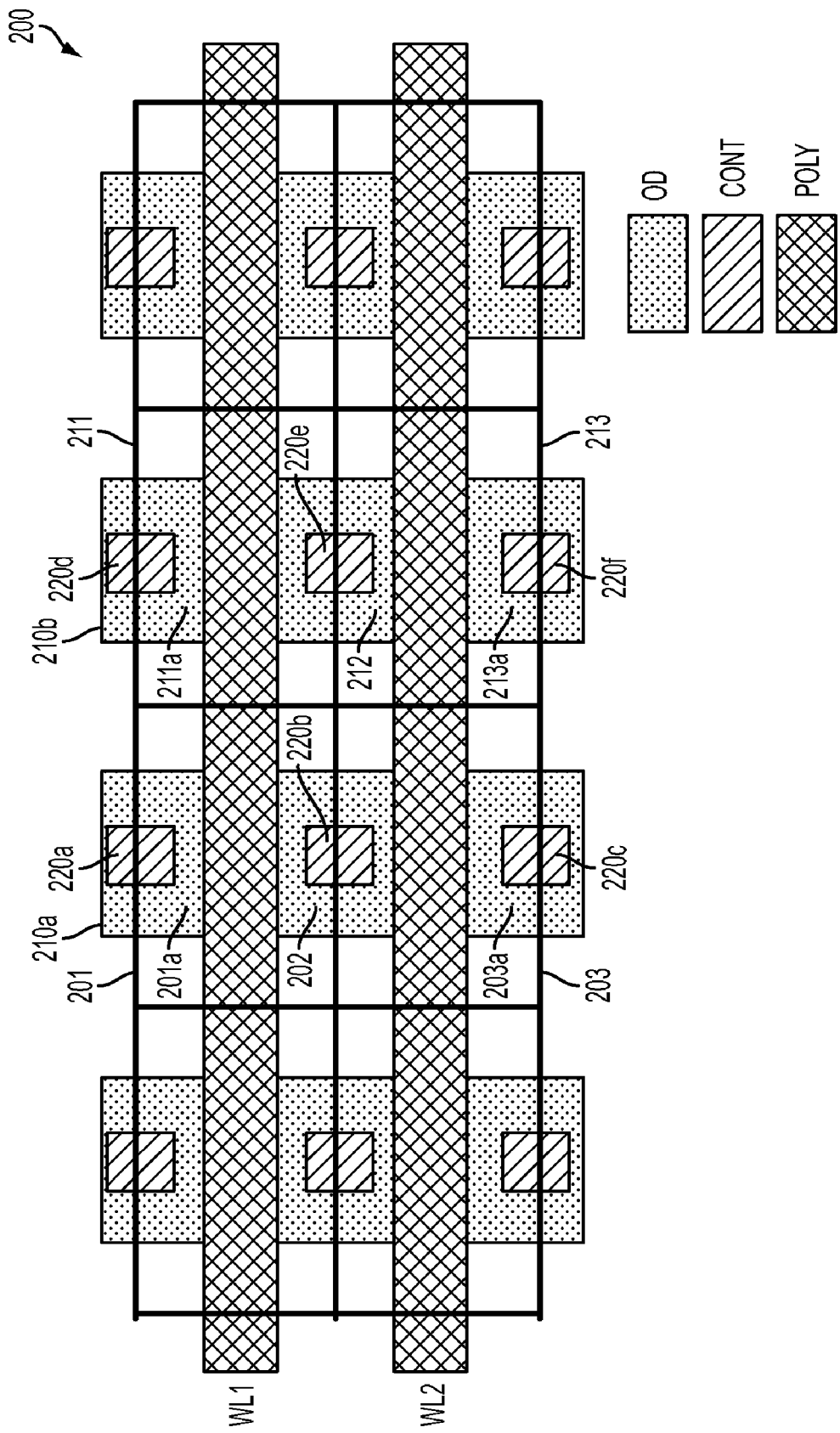

FIGS. 2A-2D are schematic drawings illustrating various layers of an exemplary ROM circuit. Items of FIGS. 2A-2D that are the same items in FIG. 1 are indicated by the same reference numerals increased by 100. FIG. 2A can include an oxide definition (OD) layer, a poly layer (POLY), and a contact layer (CONT). The OD layer can include OD regions 210a and 210b. The poly layer can include the word lines WL1 and WL2. The contact layer can include contact plugs 220a-220f.

In FIG. 2A, an integrated circuit 200 can include memory cells 201, 203, 211, and 213. The memory cells 201 and 203 can have a common S/D region 202. The memory cells 211 and 213 can have a common S/D region 212. Each of the common S/D regions 202 and 212 can be a portion of the OD regions 210a and 210b, respectively. The common S/D regions 202 and 212 can be coupled with the contact plugs 220b and 220e, respectively. Source ends 210a, 203a, 211a, and 213a can be coupled with the contact plugs 220a, 220c, 220d, and 220f, respectively.

Figure 2B:
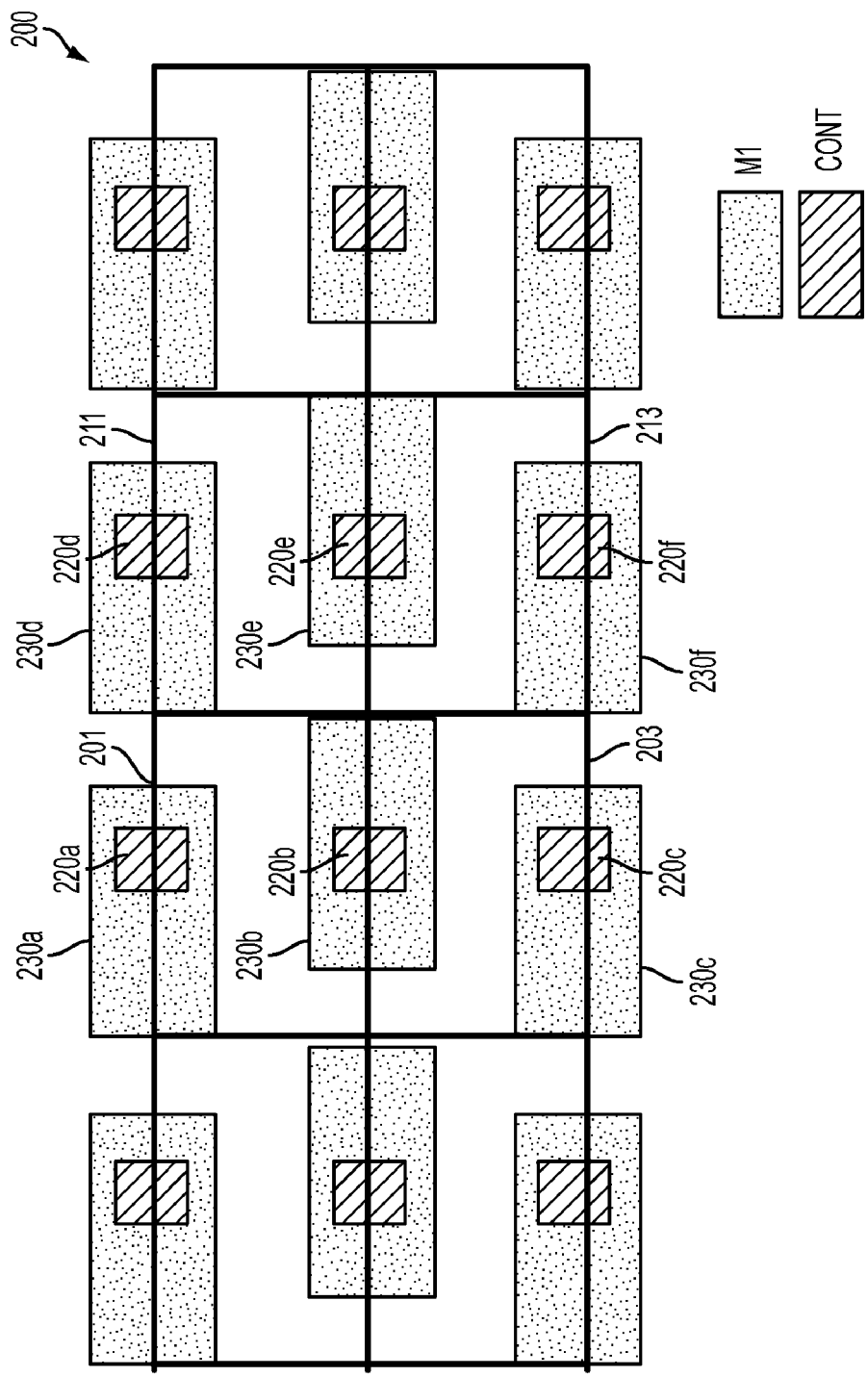

FIG. 2B can include the contact layer and a metal 1 (M1) layer. The M1 layer can include metallic regions 230a-230f. The metallic regions 230a-230f can be coupled with the contact plugs 220a-220f, respectively. The source ends 210a, 203a, 211a, and 213a and the common S/D regions 202 and 212 can be coupled with the metallic regions 230a, 230c, 230d, 230f, 230b, and 230e through the contact plugs 220a, 220c, 220d, 220f, 220b, and 220e, respectively.

Figure 2C:
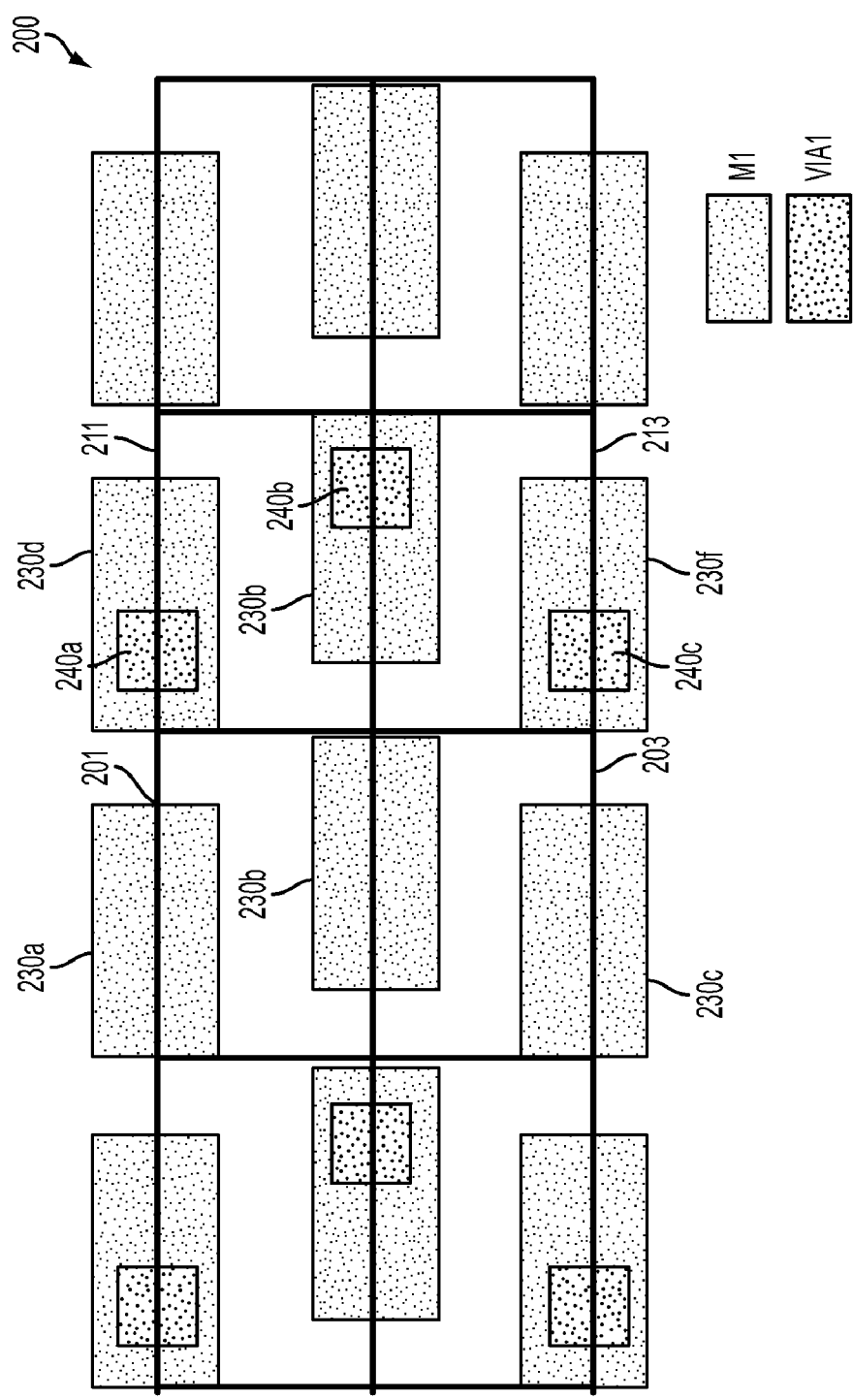

FIG. 2C can include the M1 layer and a via 1 layer. The via 1 layer can include via plugs 240a-240c. The via plugs 240a-240c can be coupled with the metallic regions 230d-230f, respectively. The source end 211a, 213a and the common S/D region 212 can be coupled with the via plugs 240a, 240c, and 240b through the metallic regions 230d, 230f, and 230e, and the contact plugs 230d, 230f, and 230e, respectively.

FIG. 2D can include the via 1 layer and a metal 2 (M2) layer. The M2 layer can include the bit lines BL1 and BL2 and ground lines VSS1 and VSS2. The bit line BL2 can be coupled with the via plug 240b. The ground line VSS2 can be coupled with the via plugs 240a and 240c. The source end 211a and 213a can be coupled with the ground line VSS2 through the metallic regions 230d and 230f, the contact plugs 230d and 230f, and the via plugs 240a and 240c, respectively. The common S/D region 212 can be coupled with the bit line BL2 through the metallic region 230e, the contact plug 230e, and the via plug 240b.

In some embodiments, the via 1 layer can be the coding layer of the memory circuit 200. As noted, the memory cells 201 and 203 can have logic "0" data and the memory cells 211 and 213 can have logic "1" data. For the logic "1" memory cells 211 and 213, the source ends 211a and 213a can be coupled with the ground line VSS2 through the contact plugs 220d and 220f, the metallic regions 230d and 230f, the via plugs 240a and 240c, respectively. The common S/D region 212 can be electrically coupled with the bit line BL2 through the contact plug 220e, the metallic region 230e, and the via plug 240b.

For the logic "0" memory cells 201 and 203, the source ends 201a and 203a can be electrically isolated from the ground line VSS1 since no via plug is disposed between the ground line VSS1 and the metallic regions 230a and 230c. The common S/D region 202 can be electrically isolated from the bit line BL1 since no via plug is disposed between the bit line BL1 and the metallic region 230b.

It is noted that the layout layers of the memory circuit 200 described above in conjunction with FIG. 2 are merely exemplary. Any memory circuits having different layout layers can be used. It is noted that the coding layer via 1 described above in conjunction with FIG. 2 is merely exemplary. The coding layer can be the contact layer, the M1 layer, the via 1 layer, or any combinations thereof. It is also noted that the number of the contact layer, the M1 layer, the via 1 layer, and M2 layer described above are merely exemplary. More layers, e.g., a via 2 layer, a metal 3 (M3), can be disposed thereover.

Figure 3:
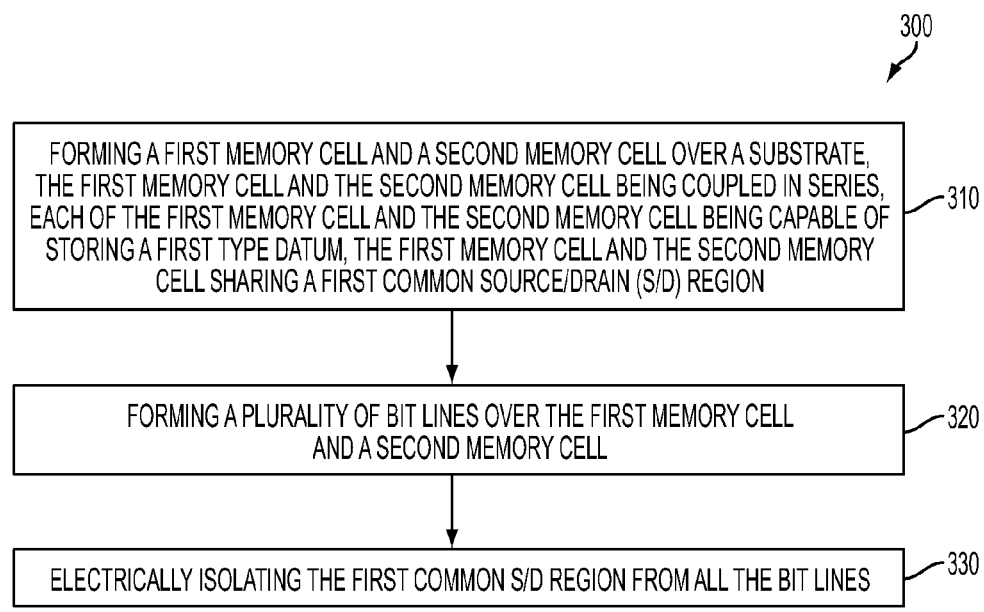
FIG. 3 is a flowchart illustrating an exemplary method for forming a memory circuit.

FIG. 3 is a flowchart illustrating an exemplary method for forming a memory circuit. In FIG. 3, a method 300 can include a process 310 forming a first memory cell and a second memory cell, e.g., memory cells 201 and 203 shown in FIG. 2A, over a substrate. The memory cells 201 and 203 can be coupled in series. Each of the memory cells 201 and 203 is capable of storing a first type datum. The memory cells 201 and 203 can share a common source/drain region 202 shown in FIG. 2A. A process 320 can form a plurality of bit lines, e.g., bit lines BL1 and BL2, over the memory cells 201 and 203. The process 330 can electrically isolate the common S/D region 202 from the bit lines BL1 and BL2.

In some embodiments electrically isolating the common S/D region 202 from the bit lines BL1 and BL2, the process 330 can be free from forming a via plug, a contact plug, a metallic region, or combinations thereof between the common S/D region 202 and the bit lines BL1 and BL2. In some embodiments electrically isolating the common S/D region 202 from the bit lines BL1 and BL2 on the via 1 layer, the process 330 can be free from forming a via plug between the metallic region 230b and the bit lines BL1 and BL2. In some embodiments, the layer for electrically isolating the common S/D region 202 and the bit lines BL1 and BL2 can be the same layer as the coding layer, e.g., the via 1 layer, of the ROM circuit 200. In other embodiments, the layer, e.g., the contact layer, for electrically isolating the common S/D region 202 and the bit lines BL1 and BL2 can be different from the coding layer, e.g., the via 1 layer, of the ROM circuit 200.

In some embodiments, the substrate (not shown) can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, forming the memory cells 201 and 203 can include defining the OD regions 210a and 210b and forming the word lines WL1 and WL2. The OD regions 210a and 210b can be defined by a STI process, a LOCOS process, or other suitable process that can form a desired isolation structure. Areas around the OD regions 210a and 210b can include materials such as oxide, nitride, oxynitride, other dielectric material that can isolate the OD region 210a from the OD region 210b, and/or any combinations thereof.

In some embodiments, the word lines WL1 and WL2 can be formed using processes such as, deposition, photolithography, wet etching, dry etching (e.g., reactive ion etch (RIE)), plasma etching, and/or other suitable processes. The word lines WL1 and WL2 may include polysilicon, Ti, TiN, TaN, Ta, TaC, TaSiN, W, WN, MoN, MoON, $RuO_2$, and/or other suitable materials. The word lines WL1 and WL2 may include one or more layers formed by physical vapor deposition (PVD), CVD, ALD, plating, and/or other suitable processes.

In some embodiments, the common S/D region 202 and the source ends 201a and 203a can be formed by implanting dopants within the OD region 210a. For embodiments forming N-channel memory cells, the common S/D region 202 and the source ends 201a and 203a can have dopants such as Arsenic (As), Phosphorus (P), other group V element, or the combinations thereof. In other embodiments, the common S/D region 202 and the source ends 201a and 203a can include silicide for low resistances. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs.

In some embodiments, the contact plugs 220a-220f (shown in FIG. 2A) can include materials such as tungsten, aluminum, copper, titanium, tantalum, titanium nitride, tantalum nitride, nickel silicide, cobalt silicide, other proper conductive materials, and/or combinations thereof. The contact plugs 220a-220f can be formed by any suitable processes, such as deposition, photolithography, and etching processes, and/or combinations thereof.

In some embodiments, the metallic regions 230a-230f (shown in FIG. 2B) can be formed over the contact plugs 220a-220f. The metallic regions 230a-230f can include materials such as aluminum, copper, titanium, tantalum, titanium nitride, tantalum nitride, nickel silicide, cobalt silicide, other proper conductive materials, and/or combinations thereof. The metallic regions 230a-230f can be formed by any suitable processes, such as deposition, photolithography, and etching processes, and/or combinations thereof.

In some embodiments, at least one dielectric layer (not shown) can be disposed between the substrate and the metallic regions 230a-230f. The dielectric layer may include materials such as oxide, nitride, oxynitride, low-k dielectric material, ultra low-k dielectric material, or any combinations thereof. The dielectric layer may be formed by, for example, a CVD process, a HDP CVD process, a HARP, a spin-coating process, other deposition process, and/or any combinations thereof.

In some embodiments, the via plugs 240a-240c (shown in FIG. 2C) can be formed over the metallic regions 230d-230f, respectively. The via plugs 240a-240c can include materials such as tungsten, aluminum, copper, titanium, tantalum, titanium nitride, tantalum nitride, nickel silicide, cobalt silicide, other proper conductive materials, and/or combinations thereof. The via plugs 240a-240c can be formed by any suitable processes, such as deposition, photolithography, and etching processes, and/or combinations thereof.

In some embodiments, the bit lines BL1-BL2 and ground lines VSS1-VSS2 (shown in FIG. 2D) can be formed over the via plugs 240a-240c. The bit lines BL1-BL2 and ground lines VSS1-VSS2 can include materials such as aluminum, copper, titanium, tantalum, titanium nitride, tantalum nitride, nickel silicide, cobalt silicide, other proper conductive materials, and/or combinations thereof. The bit lines BL1-BL2 and ground lines VSS1-VSS2 can be formed by any suitable processes, such as deposition, photolithography, and etching processes, and/or combinations thereof.

In some embodiments, another dielectric layer (not shown) can be disposed between the metallic regions 230a-230f and the bit lines BL1-BL2 and ground lines VSS1-VSS2. The dielectric layer may include materials such as oxide, nitride, oxynitride, low-k dielectric material, ultra low-k dielectric material, or any combinations thereof. The dielectric layer may be formed by, for example, a CVD process, a HDP CVD process, a HARP, a spin-coating process, other deposition process, and/or any combinations thereof. It is noted that at least one dielectric layer, passivation layer, other passivation structure, and/or combinations thereof may be formed over the bit lines BL1 and BL2.

Figure 4:
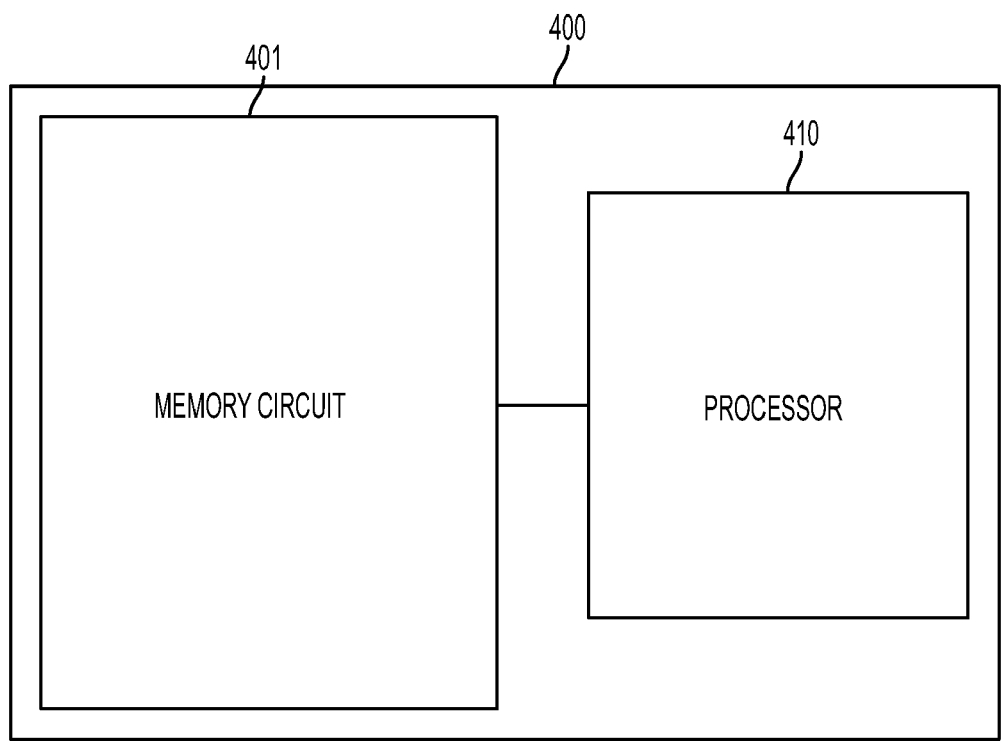
FIG. 4 is a schematic drawing showing a system including an exemplary memory circuit.

FIG. 4 is a schematic drawing showing a system including an exemplary memory circuit. In FIG. 4, a system 400 can include a processor 410 coupled with a memory circuit 401. In some embodiments, the processor 410 can be a processing unit, central processing unit, digital signal processor, or other processor that is suitable for accessing data of memory circuit 401. The memory circuit 401 can be similar to the memory circuit 100 described above in conjunction with FIG. 1.

In some embodiments, the processor 410 and the memory circuit 401 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 400 including the memory circuit 401 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a plurality of bit lines; and
a first memory cell and a second memory cell being coupled in series, each of the first memory cell and the second memory cell being capable of storing a first type datum, the first memory cell and the second memory cell sharing a first common source/drain (S/D) region, the first common S/D region being electrically isolated from the plurality of bit lines;
wherein the first memory cell further has another S/D region which is electrically isolated from the plurality of bit lines.

2. The memory circuit of claim 1 further comprising:
a third memory cell and a fourth memory cell being coupled in series, each of the third memory cell and the fourth memory cell being capable of storing a second type datum, the third memory cell and the fourth memory cell sharing a second common S/D region, the second common S/D region being coupled with one of the bit lines.

3. The memory circuit of claim 2, wherein the first type datum is logic 0 and the second type datum is logic 1.

4. The memory circuit of claim 1, wherein the bit lines are disposed on a metal 2 (M2) layer.

5. The memory circuit of claim 1, wherein the first common S/D region includes drain ends of the first memory cell and the second memory cell.

6. The memory circuit of claim 5, wherein source ends of the first memory cells and the second memory cell are electrically isolated from the plurality of bit lines.

7. The memory circuit of claim 1, wherein the memory circuit is a read only memory (ROM) circuit and the first common S/D region is electrically isolated from the plurality of bit lines on a coding layer of the ROM circuit.

8. A system comprising:
a processor; and
a memory circuit coupled with the processor, the memory circuit comprising:
a plurality of bit lines; and
a first memory cell and a second memory cell being coupled in series, each of the first memory cell and the second memory cell being capable of storing a first type datum, the first memory cell and the second memory cell sharing a first common source/drain (S/D) region, the first common S/D region being electrically isolated from the plurality of bit lines;

wherein the first common S/D region is free of electrical connections to circuitry outside the first memory cell and second memory cell.

9. The system of claim 8, wherein the memory circuit further comprises:

a third memory cell and a fourth memory cell being coupled in series, each of the third memory cell and the fourth memory cell being capable of storing a second type datum, the third memory cell and the fourth memory cell sharing a second common S/D region, the second common S/D region being coupled with one of the bit lines.

10. The system of claim 9, wherein the first type datum is logic 0 and the second type datum is logic 1.

11. The system of claim 8, wherein the bit lines are disposed on a metal 2 (M2) layer.

12. The system of claim 11, wherein the first common S/D region is electrically isolated from the plurality of bit lines by free from forming a contact plug, a metallic region, a via 1 plug, or any combinations thereof between the first common S/D region and the plurality of bit lines.

13. The system of claim 8, wherein the first common S/D region includes drain ends of the first memory cell and the second memory cell.

14. The system of claim 13, wherein source ends of the first memory cell and the second memory cell are electrically isolated from the plurality of bit lines.

15. The system of claim 8, wherein the memory circuit is a read only memory (ROM) circuit and the first common S/D region is electrically isolated from the plurality of bit lines on a coding layer of the ROM circuit.

16. A method for forming a memory circuit, the method comprising:

forming a first memory cell and a second memory cell over a substrate, the first memory cell and the second memory cell being coupled in series, each of the first memory cell and the second memory cell being capable of storing a first type datum, the first memory cell and the second memory cell sharing a first common source/drain (S/D) region;

forming a plurality of bit lines over the first memory cell and the second memory cell; and electrically isolating the first common S/D region from the plurality of bit lines;

wherein each of the first memory cell and the second memory cell has a further S/D region; and wherein the method further comprises electrically isolating the further S/D region of each of the first memory cell and the second memory cell from the plurality of bit lines.

17. The method of claim 16 further comprising:

forming a third memory cell and a fourth memory cell over the substrate, the third memory cell and the fourth memory cell being coupled in series, each of the third memory cell and the fourth memory cell being capable of storing a second type datum, the third memory cell and the fourth memory cell sharing a second common S/D region; and electrically coupling the second common S/D region with one of the plurality of bit lines.

18. The method of claim 16, wherein electrically isolating the first common S/D region from the plurality of bit lines comprises free from a contact plug, a metallic region, a via 1 plug, or any combinations thereof between the first common S/D region and the bit lines.

19. The method of claim 17, wherein each of the third memory cell and the fourth memory cell has a further S/D region; and the method further comprises electrically isolating the further S/D region of each of the third memory cell and the fourth memory cell from the plurality of bit lines.

20. The memory circuit of claim 2, wherein each of the second, third and fourth memory cells further has another S/D region which is electrically isolated from the plurality of bit lines.

* * * * *